United States Patent
Inaba et al.

(10) Patent No.: US 9,459,031 B2
(45) Date of Patent: Oct. 4, 2016

(54) COOLING APPARATUS AND COOLING SYSTEM

(71) Applicant: NEC Corporation, Tokyo (JP)

(72) Inventors: Kenichi Inaba, Tokyo (JP); Minoru Yoshikawa, Tokyo (JP); Hitoshi Sakamoto, Tokyo (JP); Akira Shoujiguchi, Tokyo (JP); Masaki Chiba, Tokyo (JP); Arihiro Matsunaga, Tokyo (JP)

(73) Assignee: NEC Corporation, Tokyo (JP)

(*) Notice: Subject to any disclaimer, the term of this patent is extended or adjusted under 35 U.S.C. 154(b) by 219 days.

(21) Appl. No.: 14/378,659

(22) PCT Filed: Feb. 13, 2013

(86) PCT No.: PCT/JP2013/000749
§ 371 (c)(1),
(2) Date: Aug. 14, 2014

(87) PCT Pub. No.: WO2013/121772
PCT Pub. Date: Aug. 22, 2013

(65) Prior Publication Data
US 2016/0018143 A1    Jan. 21, 2016

(30) Foreign Application Priority Data

Feb. 14, 2012 (JP) ................................. 2012-029603
Nov. 1, 2012 (JP) ................................. 2012-241992

(51) Int. Cl.
*F25B 43/00* (2006.01)
*G06F 1/20* (2006.01)
(Continued)

(52) U.S. Cl.
CPC ............... *F25B 43/00* (2013.01); *F25B 39/00* (2013.01); *F28D 15/0266* (2013.01); *G06F 1/20* (2013.01); *H05K 7/20818* (2013.01); *F25B 39/02* (2013.01); *F25B 39/04* (2013.01)

(58) Field of Classification Search
CPC .... F25B 43/00; F25B 39/00; H05K 7/20818
See application file for complete search history.

(56) References Cited

U.S. PATENT DOCUMENTS

2004/0221604 A1* 11/2004 Ota .................... H05K 7/20781
                                                                62/259.2
2009/0201645 A1*  8/2009 Kashirajima .......... F25B 25/00
                                                                361/700

(Continued)

FOREIGN PATENT DOCUMENTS

| GB | 2481317 A  | 12/2011 |
|----|------------|---------|
| JP | 5-312361   | 11/1993 |

(Continued)

OTHER PUBLICATIONS

International Search Report and Written Opinion mailed Apr. 16, 2013.

(Continued)

*Primary Examiner* — Emmanuel Duke
(74) *Attorney, Agent, or Firm* — Finnegan, Henderson, Farabow, Garrett & Dunner LLP

(57) ABSTRACT

A cooling apparatus includes N (N is an integer of 2 or larger) refrigerant storage units arranged in a vertical direction and configured to store refrigerants, a condensation unit disposed above the N refrigerant storage units, a steam pipe for circulating gas phase refrigerants flowing out of the N refrigerant storage units to the condensation unit, a liquid pipe for circulating a liquid phase refrigerant flowing out of the condensation unit to an uppermost refrigerant storage unit, and separation piping for circulating a liquid phase refrigerant flowing out of an upper refrigerant storage unit to a lower refrigerant storage unit. The liquid phase refrigerant flows into each refrigerant storage unit via an inlet, and flows out from the refrigerant storage unit via a first connection port formed below the inlet.

19 Claims, 14 Drawing Sheets

(51) Int. Cl.
*H05K 7/20* (2006.01)
*F28D 15/02* (2006.01)
*F25B 39/00* (2006.01)
*F25B 39/02* (2006.01)
*F25B 39/04* (2006.01)

(56) References Cited

U.S. PATENT DOCUMENTS

2011/0056223 A1   3/2011   Kashirajima et al.
2012/0218711 A1   8/2012   Kashirajima et al.

FOREIGN PATENT DOCUMENTS

| | | |
|---|---|---|
| JP | 2009-194093 | 8/2009 |
| JP | 2010-190553 | 9/2010 |
| JP | 2010190553 A * | 9/2010 |
| WO | WO 2011/122207 | 10/2011 |

OTHER PUBLICATIONS

Extended European Search Report mailed Jul. 8, 2016, by the European Patent Office in counterpart European Patent Application No. 13749493.6.

* cited by examiner

COOLING APPARATUS AND COOLING SYSTEM

CROSS-REFERNCE TO RELATED PATENT APPLICATIONS

This application is a National Stage Entry of International Application No. PCT/JP2013/000749, filed Feb. 13, 2013, which claims priority from Japanese Patent Application Nos. 2012-029603, filed Feb. 14, 2012 and 2012-241992, filed Nov. 1, 2012. The entire contents of the above-referenced applications are expressly incorporated herein by reference.

TECHNICAL FIELD

The present invention relates to a cooling apparatus and a cooling system, and more particularly to a cooling apparatus and a cooling system for cooling heat from a plurality of heat sources.

BACKGROUND ART

Recently, with improvement of an information processing technology and development of an Internet environment, a required information processing volume has increased. This trend has been accompanied by taking attention on data center business that installs and runs apparatuses such as server apparatuses used for the Internet, communication apparatuses, fixed telephones, or IP (Internet Protocol) telephones.

A number of electronic devices such as computers are installed in a server room of the data center. As a method for installing electronic devices in a server room, a method using a rack-mount method is the mainstream. The rack-mount method is a method for installing by stacking flat electronic devices standardized according to JIS (Japanese Industrial Standards) or EIA (Electronic Industries Alliance) on a rack.

To secure sufficient space in a server room, as many electronic devices as possible are desirably mounted on a rack. Thus, it is desirable to lower the height of each electronic device. The height of an electronic device such as a 1 U (Unit) server or a blade server, referred to as a rack-mount server, is generally about 40 millimeters. To cool heat discharged from a rack-mount server, it is necessary to simultaneously cool a plurality of stacked heat sources having different height.

A cooling technology of the heat discharged from a rack-mount server is disclosed in, for example, Patent Literature 1. The Patent Literature 1 discloses a technology for cooling servers having different height arranged in respective server rooms of two floors, upper and lower, by using a boiling cooling method. An evaporator and a temperature sensor are arranged near an outlet of each of servers installed in the server rooms of the upper and lower floors. A refrigerant evaporated in each evaporator is cooled in a condenser disposed outside the server rooms to be condensed, and then flows again into the evaporator.

In a cooling apparatus of the Patent Literature 1, after a measurement temperature measured by each temperature sensor has been input to a controller, the controller controls an opening of a flow rate adjustment valve disposed in each evaporation unit based on the measurement temperature. Accordingly, refrigerants of appropriate flow rates for setting exhaust air temperatures to be equal can be supplied to each of the evaporators of the upper and lower floors with different height. As a result, the exhaust temperature of air discharged from the server room to the evaporator can be adjusted to a temperature environment suited for operating servers, and degradation of cooling performance caused by a shortage of a refrigerant flow rate can be suppressed.

CITATION LIST

Patent Literature

Patent Literature 1: Japanese Laid-open Patent Publication No. 2010-190553 (paragraph 0039)

SUMMARY OF INVENTION

Technical Problem

The cooling apparatus of the Patent Literature 1, however, has a problem of having a complicated structure, because it is necessary to arrange the temperature sensor, the flow rate adjustment valve controlled on the basis of the temperature measured by the temperature sensor, and the controller for controlling the flow rate adjustment valve in order to supply the refrigerants of appropriate flow rates to the evaporators with different height.

It is an object of the present invention to provide a cooling apparatus and a cooling system capable of solving the aforementioned problem.

Solution to Problem

A cooling apparatus according to the present invention includes N (N is an integer of 2 or larger) refrigerant storage units disposed in a vertical direction and configured to store refrigerants, a condensation unit disposed above the N refrigerant storage units, a steam pipe for circulating a gas phase refrigerants flowing out of the N refrigerant storage units to the condensation unit, a liquid pipe for circulating a liquid phase refrigerant flowing out of the condensation unit to an uppermost refrigerant storage unit, and separation piping for circulating the liquid phase refrigerant flowing out of an upper refrigerant storage unit to a lower refrigerant storage unit, in which the liquid phase refrigerant flows into each refrigerant storage unit via an inlet, and flows out from the refrigerant storage unit via a first connection port formed below the inlet.

A cooling system according to the present invention includes a casing, electronic devices, a plurality of stages of mounting shelves for mounting the electronic devices, and the aforementioned cooling apparatus, in which the evaporation units and the electronic devices are disposed on the mounting shelves to face each other, and the condensation unit is disposed outside the casing.

Advantageous Effects of Invention

According to the cooling apparatus and the cooling system of the present invention, electronic devices arranged at a plurality of stages can be easily cooled with a simple structure.

DESCRIPTION OF EMBODIMENTS (First Exemplary Embodiment)

Figure 1:
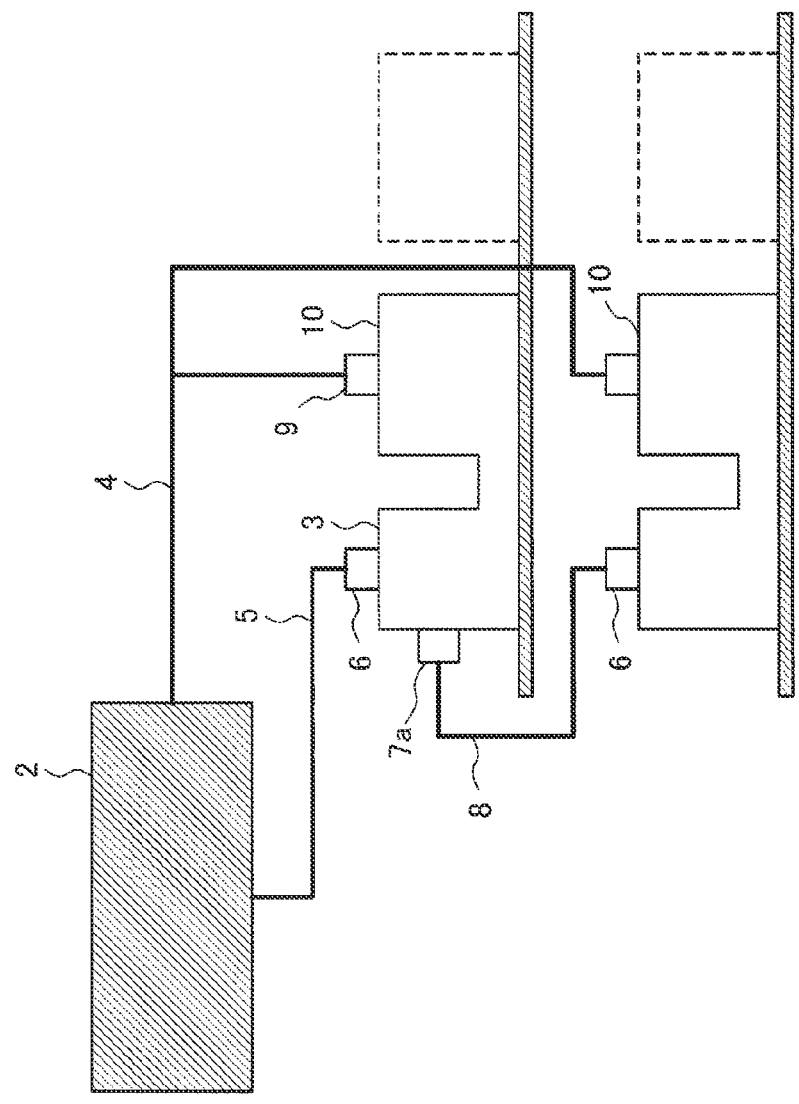
FIG. 1 is a sectional view illustrating the configuration of a cooling apparatus according to a first exemplary embodiment of the present invention.

A first exemplary embodiment will be described in detail referring to the drawings. FIG. 1 is a sectional view illustrating a cooling apparatus 20 according to the embodiment. As illustrated in FIG. 1, respective cooling apparatuses 20 according to the embodiment are arranged corresponding to a plurality of electronic devices stacked in a vertical direction and the cooling apparatus 20 includes refrigerant storage units 10, a condensation unit 2, a steam pipe 4, a liquid pipe 5, and separation piping 8. The condensation unit 2 is disposed above the refrigerant storage units 10.

Each refrigerant storage unit 10, which has a structure for storing refrigerants, includes an inlet 6, a first connection port 7a, and an outlet 9. Each refrigerant storage unit 10 is connected to the condensation unit 2 via the outlet 9 and the steam pipe 4 through which a gas phase refrigerant flows.

The refrigerant storage unit 10 located at an uppermost part is connected to the condensation unit 2 via the inlet 6 and the liquid pipe 5 through which a liquid phase refrigerant flows, and connected to another refrigerant storage unit 10 located below via the first connection port 7a and the separation piping 8.

On the other hand, the refrigerant storage unit(s) 10 located at a part other than the uppermost part is connected to another refrigerant storage unit 10 located above via the inlet 6 and the separation piping 8 through which the liquid phase refrigerant flows, and connected to yet another refrigerant storage unit 10 located below via the first connection port 7a and the separation piping 8.

In the refrigerant storage unit(s) 10, the first connection port 7a is located lower than both of the outlet 9 and the inlet 6. In FIG. 1, the first connection port 7a of the refrigerant storage unit 10 disposed at a lowermost part is closed.

According to the cooling apparatus 20 thus configured, steam of the refrigerant evaporated in each refrigerant storage unit 10 by absorbing heat generated from the electronic device flows out from the outlet 9 to flow into the condensation unit 2 via the steam pipe 4.

The steam of the refrigerant which has flowed into the condensation unit 2 is cooled, and condensed to be liquefied in the condensation unit 2, and then the liquefied refrigerant flows into the uppermost refrigerant storage unit 10 from the inlet 6 via the liquid pipe 5. As for the liquefied refrigerant that has flowed into the uppermost refrigerant storage unit 10, the liquid surface is higher than the first connection port 7a since the first connection port 7a is disposed lower than the outlet 9 and the inlet 6. Thus, the liquefied refrigerant flows out from the first connection port 7a, and flows into the lower refrigerant storage unit 10 via the separation piping 8. Then, each of the plurality of refrigerant storage units 10 stacked in the vertical direction is filled with the liquefied refrigerant up to a position defined by a disposing position of the first connection port 7a.

Thus, the cooling apparatus 20 according to the embodiment can easily cool the electronic devices arranged at the plurality of stages with a simple structure.

(Second Exemplary Embodiment)

Figure 2:
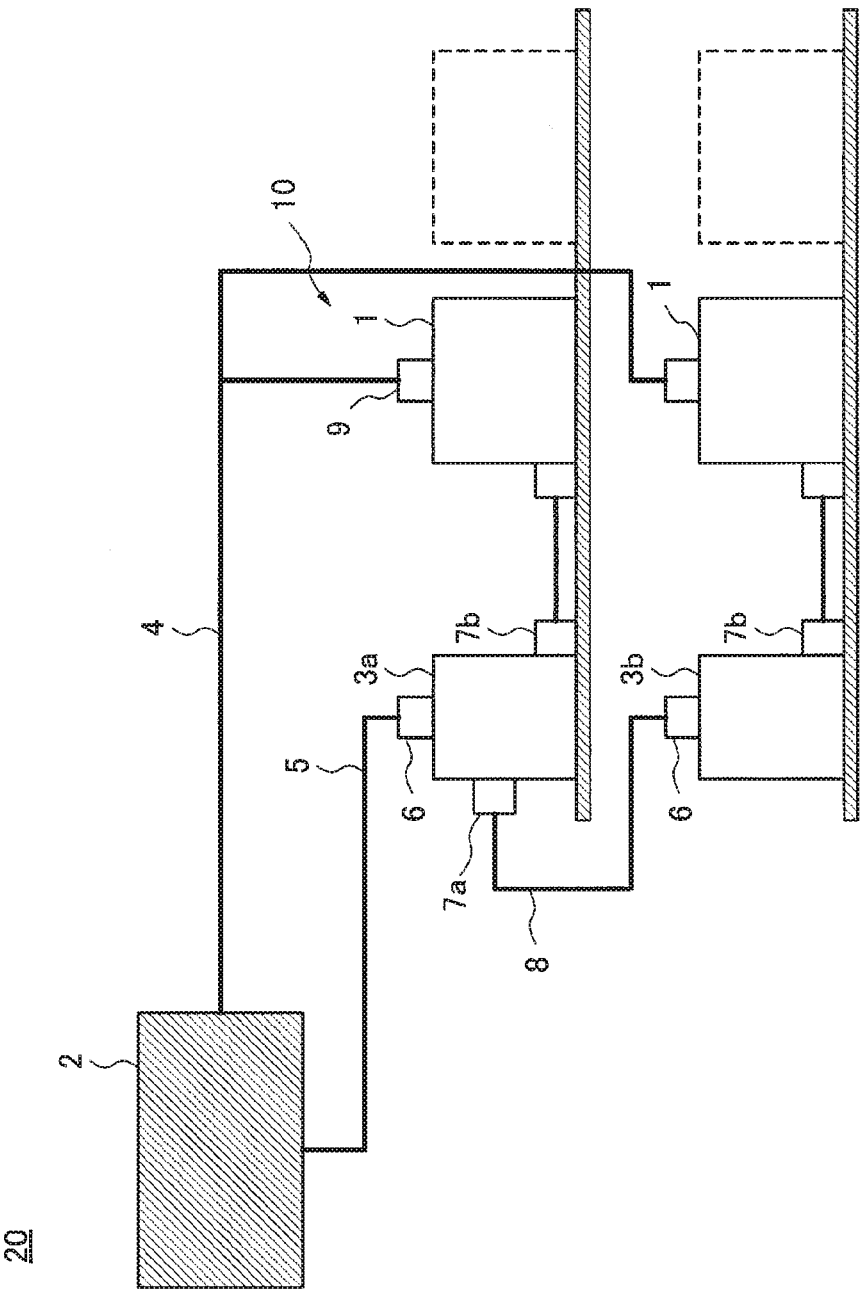
FIG. 2 is a sectional view illustrating the configuration of a cooling apparatus according to a second exemplary embodiment of the present invention.

A second exemplary embodiment will be described. FIG. 2 is a sectional view illustrating a cooling apparatus 20 according to the embodiment. As illustrated in FIG. 2, the cooling apparatus 20 according to the embodiment includes evaporation units land separation tanks 3 (3a and 3b) which are arranged corresponding to a plurality of electronic devices stacked in a vertical direction, a condensation unit 2, a steam pipe 4, a liquid pipe 5, and a separation piping 8. In FIG. 2, the electronic devices are indicated by dotted lines.

Each evaporation unit 1 has a sealed structure and stores refrigerant therein. In the embodiment, as a specific refrigerant, HFC (hydrofluorocarbon) or HFE (hydrofluor ether) is used, however, a refrigerant material is not limited to this. When the evaporation unit 1 receives heat discharged from corresponding electronic device, the refrigerant stored in the evaporation unit 1 boils to evaporate, and steam of the refrigerant flows out from an outlet 9.

To transport the steam of the refrigerant evaporated in the evaporation unit 1 to the condensation unit 2, the outlet 9 is preferably disposed at an upper part of the evaporation unit 1. In the embodiment, the outlet 9 is disposed at a top surface of the evaporation unit 1. The steam of the refrigerant boiled in the lower evaporation unit 1 merges with the steam of the refrigerant boiled in the upper evaporation unit 1 to be transported to the condensation unit 2.

The condensation unit 2, which is a metallic casing, cools the inflow steam of the refrigerant. The condensation unit 2 disposed above the evaporation units 1 includes a connection port connected to the steam pipe 4 and a connection port connected to the liquid pipe 5. The connection port of the condensation unit 2 connected to the liquid pipe 5 is located lower than the connection port connected to the evaporation pipe 4. A material of the condensation unit 2 is not limited to a metal as long as the material has high heat conductivity.

The evaporation pipe 4 connects the evaporation units 1 with the condensation unit 2 to transport the steam of the refrigerant evaporated in each evaporation unit 1 to the condensation unit 2.

The liquid pipe 5 connects the condensation unit 2 with the separation tank 3 to transport the liquefied refrigerant condensed in the condensation unit 2 to the separation tank 3.

Each separation tank 3 is disposed at a height substantially equal to corresponding one of evaporation units 1 disposed in a vertical direction, namely, at a position facing the corresponding evaporation unit 1 in a horizontal direction. A lower surface part of the separation tank 3 and a lower surface part of the corresponding evaporation unit 1 are preferably arranged at equal heights. Hereinafter, when the separation tanks 3 arrayed in the vertical direction are distinguished to be described, an upper separation tank will be referred to as a separation tank 3a, and a lower separation tank will be referred to as a separation tank 3b. The upper separation tank 3a includes an inlet 6, a first connection port 7a, and a second connection port 7b, while the lower separation tank 3b includes an inlet 6 and a second connection port 7b.

The inlet 6 of the upper separation tank 3a is connected to the liquid pipe 5 for transporting the refrigerant liquefied in the condensation unit 2. The inlet 6 of the lower separation tank 3b is connected to the separation piping 8 for transporting the refrigerant flowed out from the upper separation tank 3. In other words, the inlet 6 is connected to either the liquid pipe 5 for transporting the refrigerant liquefied in the condensation unit 2 or the separation piping 8 for transporting the refrigerant flowed out from the upper separation tank 3. In the embodiment, the inlet 6 is disposed on the upper part of each separation tank 3. However, it is not limited to this and the inlet may be disposed on a side surface.

The first connection port 7a, which is installed on the side surface of the separation tank 3 at a position lower than the inlet 6, is connected to the inlet 6 of the lower separation tank 3b via the separation piping 8.

Thus, the refrigerant that has flowed into the separation tank 3 flows out from the first connection port 7a when the liquid surface reaches the height of the first connection port 7a, and flows into the lower separation tank 3 via the separation piping 8. In other words, the liquefied refrigerant condensed in the condensation unit 2 flows into the uppermost separation tank 3a from the inlet 6 via the liquid pipe 5. The liquefied refrigerant flowed out from the first connection port 7a of the upper separation tank 3 flows into the separation tank 3b other than the uppermost separation tank from the inlet 6 via the separation piping 8.

Each second connection port 7b connected to corresponding evaporation unit 1 allows the refrigerant that has flowed into the separation tank 3 to flow into the evaporation unit 1. Accordingly, heights of gas-liquid interfaces of the refrigerant are equal in the evaporation unit 1 and the separation tank 3. In the embodiment, the separation tank 3 and the evaporation unit 1 are connected to each other by piping via the second connection port 7b, however, the arrangement is not limited to this. The separation tank 3, the second connection port 7b, and the evaporation unit 1 may be made of the same material, and as in FIG. 1 described in the first embodiment, the second connection port 7b of the separation tank 3 and the evaporation unit 1 may be integrally formed.

The separation tanks 3 allow the refrigerant that has flowed in from the condensation unit 2 or the upper separation tank 3 to flow into the evaporation unit 1 via the second connection port 7b, and also to the lower separation tank 3b via the first connection port 7a.

The first connection port 7a is disposed at a position as high as the second connection port 7b or higher than the second connection port 7b. The inlet 6 is preferably disposed at a position higher than the first connection port 7a and the second connection port 7b. In other words, the inlet 6, the first connection port 7a, and the second connection port 7b are arranged in this order from above in the vertical direction.

Further, the first connection port 7a is located lower than the outlet 9 and the inlet 6. In other words, a lower end of the first connection port 7a is preferably disposed at a position as high as a lower end of the second connection port 7b or higher than the lower end of the second connection port 7b. An upper end of the first connection port 7a is preferably disposed at a position as high as an upper end of the second connection port 7b or higher than the upper end of the second connection port 7b.

Figure 3:
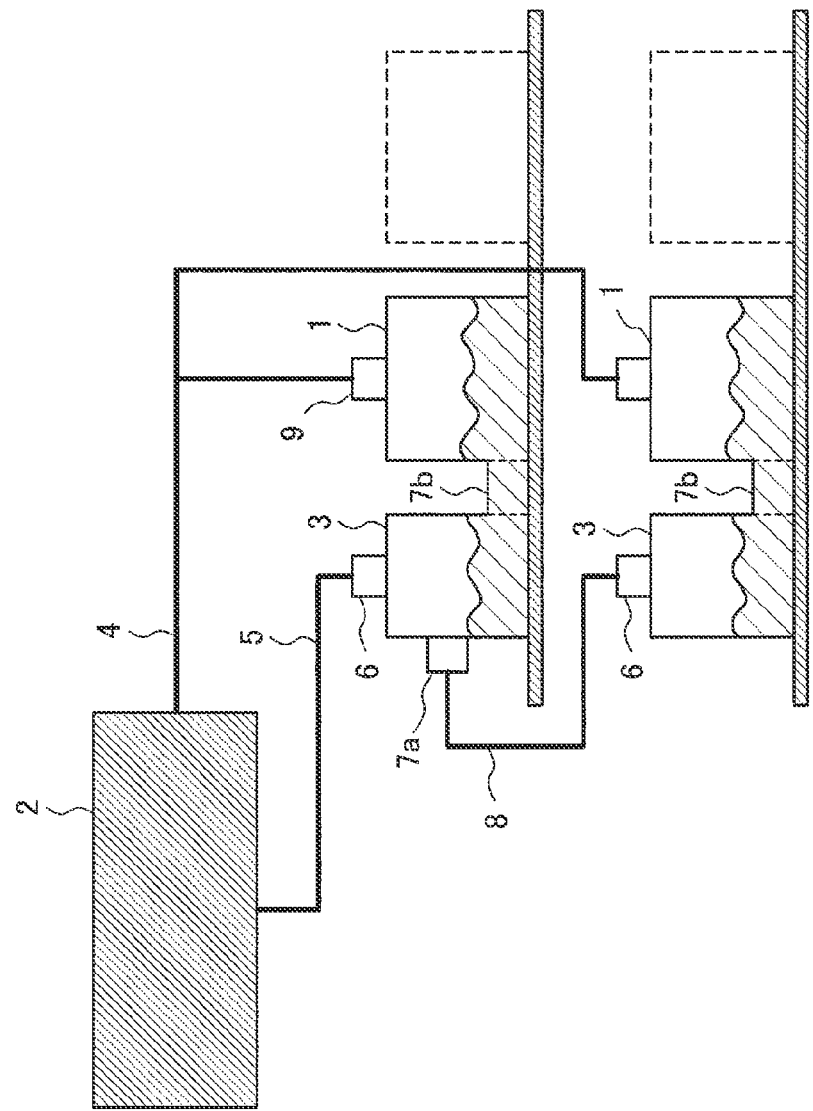
FIG. 3 is a sectional view illustrating an operation of the cooling apparatus according to the second exemplary embodiment of the present invention.

Next, an operation of the cooling apparatus 20 according to the embodiment will be described referring to FIG. 3. The evaporation units 1 are made of a material with high heat conductivity, and disposed at a position that is able to receive heat discharged from the electronic devices. Accordingly, the heat discharged from the electronic devices is conducted, via the evaporation units 1, to the refrigerant stored in the evaporation units 1.

The refrigerant receives the heat generated from the electronic devices to boil. Steam of a gas phase refrigerant generated by boiling the refrigerant provided in the sealed space of each evaporation unit 1 flows out from the outlet 9 by buoyancy generated due to a difference in gas-liquid density to be transported to the condensation unit 2 via the evaporation pipe 4.

The condensation unit 2, which has a structure of a large surface area by disposing a radiation fin or the like, not illustrated, efficiently exchanges heat with outside air. The condensation unit 2 radiates the heat of the steam of the refrigerant transported from the steam pipe 4 by exchanging heat with the outside air.

The gas phase refrigerant transported to the condensation unit 2 is cooled by radiating heat in the condensation unit 2, and condensed to be liquefied. The refrigerant liquefied at the condensation unit 2 flows into the separation tank 3 via the liquid pipe 5 by gravity, and flows into the evaporation unit 1 again via the second connection port 7b.

A case where the refrigerant liquefied at the condensation unit is flowed into the evaporation units via a common liquid pipe without disposing any first connection port 7a or any separation piping 8 will be discussed. In this case, the refrigerant liquefied at the condensation unit first stays in the lowermost evaporation unit (separation tank) via the common liquid pipe by action of gravity, and then the upper evaporation units (separation tanks) are sequentially filled with the refrigerant.

When the refrigerant in the evaporation units boils by heat from the electronic devices, the liquefied refrigerant is reduced while the steam of the gas phase refrigerant is increased. The steam of the refrigerant is moved upward by buoyancy generated due to a difference in gas-liquid density. At this time, with the above configuration, a sufficient amount of refrigerant has been stored in the lowermost evaporation unit while a necessary amount of refrigerant for cooling has not been stored in the upper evaporation unit. As a result, the lower electronic device can be cooled while the upper electronic device may not be cooled.

Thus, the cooling apparatus 20 according to the embodiment is provided with the first connection port 7a and the separation piping 8, allowing the liquefied refrigerant to flow into the uppermost separation tank 3a at first, and then allowing the refrigerant to sequentially flow from the uppermost separation tank 3a to the lower separation tank(s) 3b. In other words, when a liquid surface of the liquefied refrigerant exceeds the height of the first connection port 7a in the separation tanks 3a and 3b, the liquefied refrigerant further flows to the lower separation tank 3b via the separation piping 8. Thus, the liquefied refrigerant is distributed to the plurality of separation tanks 3 without being stored in any separation tank 3 exceeding the height of the first connection port 7a and without staying in any one of the separation tanks 3.

Thus, the cooling apparatus 20 according to the embodiment can cool both of the lower electronic device and the upper electronic device by arranging the first connection port 7a and the separation piping 8 and appropriately setting the amount of refrigerant according to the height at which the first connection port 7a is disposed.

In the embodiment, the second connection port 7b is provided at the position as high as the first connection port 7a of the separation tank 3 or lower than the first connection port 7a, and the separation tank 3 and the evaporation unit 1 are separated from each other to be connected by the second connection port 7b. With this structure, the gas-liquid interface of the refrigerant in the evaporation unit 1 is located higher than the second connection port 7b, and it is possible to reduce space in which the steam of the refrigerant boiled to evaporate in the evaporation unit 1 is located. The reduction of the space in which the steam of the refrigerant is located increases the buoyancy generated due to the difference in gas-liquid density, and accordingly the steam of the refrigerant smoothly flows out from the outlet 9.

In the embodiment, two electronic devices and two evaporation units 1 are arranged in the vertical direction, however, the present invention is not limited to this. Three or more electronic devices and three or more evaporation units 1 can be arranged in the vertical direction. When the electronic devices, the electronic devices and the evaporation units 1 are arranged by three or more in the vertical direction, the liquid surface of the refrigerant liquefied in the middle separation tank 3b rises to the height of the first connection part 7a. Accordingly, the overflowed refrigerant further flows into the lower separation tank 3 via the separation piping 8, and flows into the evaporation unit 1 via the second connection port 7b.

Thus, in the cooling apparatus 20 according to the embodiment, the upper evaporation unit 1 and the lower evaporation unit 1 allow the refrigerant of such an amount that a liquid surface reaches the height of the first connection port 7a of the separation tank 3 to flow inside. As a result, the amount of refrigerant stored in the upper evaporation unit 1 is suppressed from being smaller than that of refrigerant stored in the lower evaporation unit 1, and the electronic devices arranged at the plurality of stages in the vertical direction can be evenly cooled.

Thus, the cooling apparatus 20 according to the embodiment can easily cool the electronic devices arranged at the plurality of stages with the simple structure that includes the separation piping 8 and the separation tank 3 having the first connection port 7a and the second connection port 7b that are different in height in the vertical direction.

(Third Exemplary Embodiment)

Figure 4:
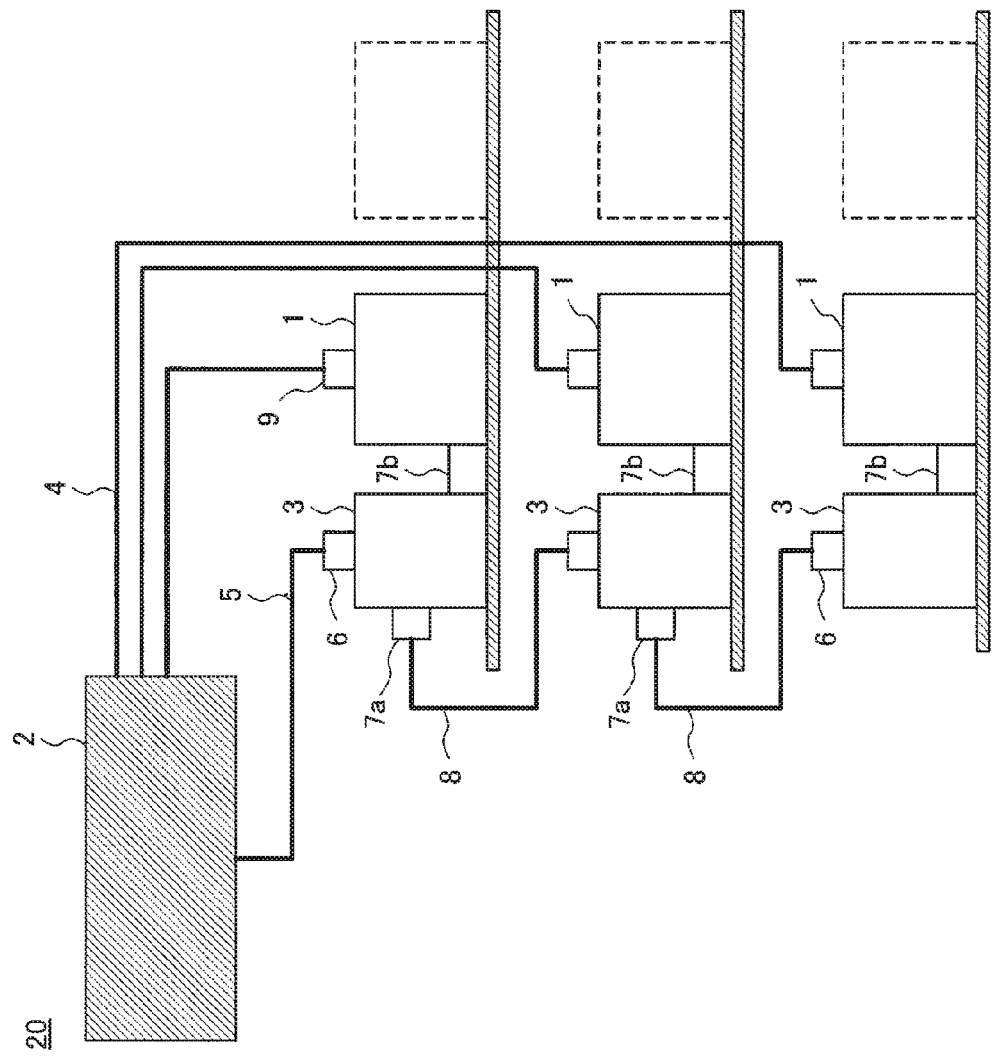
FIG. 4 is a sectional view illustrating the configuration of a cooling apparatus according to a third exemplary embodiment of the present invention.

A third exemplary embodiment will be described. FIG. 4 is a sectional view illustrating a cooling apparatus 20 according to the embodiment. The cooling apparatus 20 according to the embodiment is configured such that respective evaporation units 1 are connected to individually independent steam pipes 4. Other structures and connection relations are identical or similar to those of the first embodiment, and the cooling apparatus 20 includes evaporation units 1, a condensation unit 2, separation tanks 3, the steam pipes 4, and a liquid pipe 5.

Each evaporation unit 1 has a sealed structure and stores refrigerant therein. The evaporation unit 1 includes an outlet 9 connected to corresponding steam pipe 4 for transporting, to the condensation unit 2, a gas phase refrigerant boiled by receiving heat discharged from the electronic device. The condensation unit 2 is connected to the liquid pipe 5 for transporting, to the separation tank 3, a refrigerant condensed to be liquefied by exchanging heat with outside air. Each separation tank 3 has a height substantially equal to that of corresponding evaporation unit 1, and includes an inlet 6, a first connection port 7a, and a second connection port 7b.

Each separation tank 3 is disposed at a position facing corresponding evaporation unit 1 in a horizontal direction. The inlet 6 of the uppermost separation tank 3 is connected to the liquid pipe 5 for transporting the refrigerant liquefied at the condensation unit 2. The inlet 6 of each separation tank 3 other than the uppermost separation tank 3 is connected to separation piping 8 for transporting a refrigerant flowed out from the separation tank 3 located above.

The first connection port 7a is connected to the inlet 6 of the separation tank 3 located below via the separation piping 8.

The second connection port 7b connected to the evaporation unit 1 allows the liquefied refrigerant stored in the separation tank 3 to flow into the evaporation unit 1. The connection between the evaporation unit 1 and the separation tank 3 may be integration of the evaporation unit 1 and the separation tank 3 without disposing any second connection port 7b.

The second connection port 7b is disposed on the separation tank 3 at a position as high as the first connection port 7a or lower than the first connection port 7a. The first connection port 7a is located lower than the outlet 9 and the inlet 6. In other words, the inlet 6, the first connection port 7a, and the second connection port 7b are arranged on the separation tank 3 in this order from above in the vertical direction.

In the cooling apparatus 20 according to the embodiment, the evaporation units 1 arranged in the vertical direction are individually connected to the independent steam pipes 4. The plurality of steam pipes 4 are connected to one common condensation unit 2. In other words, as illustrated in FIG. 4, the upper evaporation unit 1, the middle evaporation unit 1, and the lower evaporation unit 1 are connected to the condensation unit 2 via the different steam pipes 4.

In the cooling apparatus 20 thus configured, the refrigerant stored in the evaporation units 1 receives heat discharged from the electronic devices to boil. Steam of the refrigerant generated by boiling the refrigerant is transported to the condensation unit 2 via the evaporation pipes 4 by buoyancy generated due to a difference in gas-liquid density. The condensation unit 2 exchanges heat with outside air to radiate the heat of the steam of the refrigerant transported from the steam pipes 4, and the refrigerant is condensed. Then, the refrigerant liquefied at the condensation unit 2 is transported to the separation tank 3 via the liquid pipe 5.

The refrigerant transported to the separation tank 3 is refluxed to the evaporation unit 1 oppositely disposed in the horizontal direction via the second connection port 7b. When the refrigerant liquefied at the condensation unit 2 is transported to the separation tank 3 and a liquid surface of the refrigerant stored in the separation tank 3 and the evaporation unit 1 reaches the height of the first connection port 7a, the overflowed refrigerant flows out to the lower separation tank 3 via the separation piping 8.

The lower separation tank 3 similarly allows the refrigerant to flow into corresponding evaporation unit 1. When the liquid surface of the refrigerant stored in the separation tank 3 and the evaporation unit 1 reaches the height of the first connection port 7a, the refrigerant flows out to still lower separation tank 3 via the separation piping 8.

In the cooling apparatus 20 according to the embodiment, three electronic devices and three evaporation units 1 are arranged in the vertical direction. However, the present invention is not limited to this. Two, or four or more electronic devices and two, or four or more evaporation units 1 can be arranged in the vertical direction.

Next, action and effect of the cooling apparatus 20 according to the embodiment will be described. In the embodiment, the plurality of evaporation units 1 arranged in the vertical direction are individually connected to the steam pipes 4. The plurality of steam pipes 4 are connected to the common condensation unit 2. In this case, compared with a case where the plurality of evaporation units 1 are connected to the condensation unit 2 via one common steam pipe 4, a flow velocity of the gas phase refrigerant flowed through the steam pipes 4 can be made lower.

The effect will be specifically described referring to FIG. 4. In a structure illustrated in FIG. 4, the steam evaporated in the three evaporation units 1 is individually connected to the condensation unit 2 via the three steam pipes 4. Thus, for example, compared with a case where the steam evaporated in the three evaporation units 1 is flowed through one common steam pipe 4 to be transported to the condensation unit 2, the amount of gas phase refrigerant flowing through each steam pipe 4 is smaller and a flow velocity of the gas phase refrigerant is lower. As a result, pressure loss of the gas phase refrigerant flowed through the steam pipes 4 is reduced so that a boiling point of the refrigerant is lowered, and heat exchanging performance in the evaporation units 1 or the condensation unit 2 can be improved.

(Fourth Exemplary Embodiment)

Figure 5:
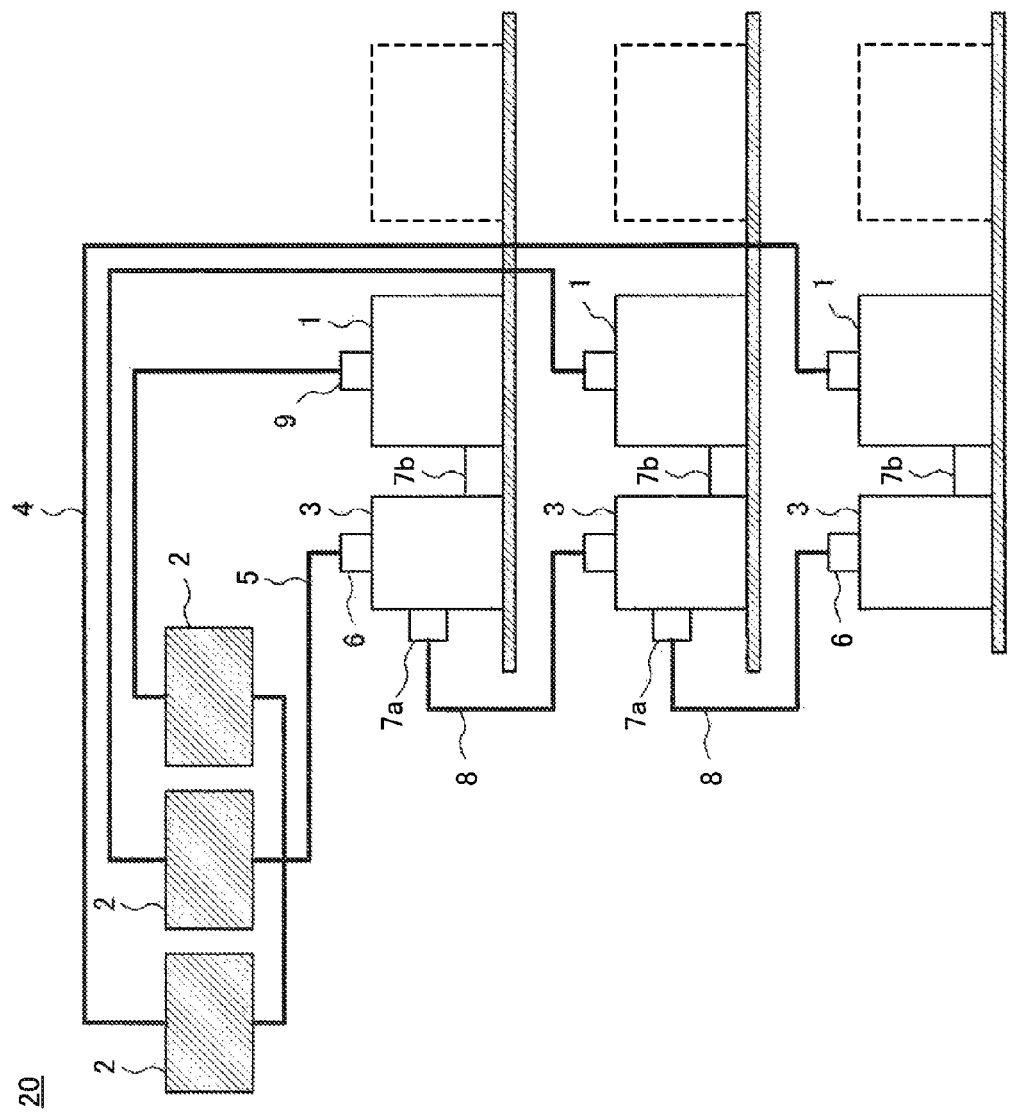
FIG. 5 is a sectional view illustrating the configuration of a cooling apparatus according to a fourth exemplary embodiment of the present invention.

A fourth exemplary embodiment will be described. FIG. 5 is a sectional view illustrating a cooling apparatus 20 according to the embodiment. The cooling apparatus 20 according to the embodiment is configured such that respective evaporation units 1 arranged in a vertical direction are connected to independent condensation units 2 via steam pipes 4. Other structures and connection relations are identical or similar to those of the first embodiment, and therefore detailed description will be omitted. In FIG. 5, three electronic devices and three evaporation units 1 are arranged in the vertical direction, however, the present invention is not limited to this. Two, or four or more electronic devices and two, or four or more evaporation units 1 can be arranged in the vertical direction.

The cooling apparatus 20 according to the embodiment is provided with the same number of condensation units 2 as that of evaporation units 1, that are independently arranged, and the evaporation units 1 arrayed in the vertical direction are individually connected to the corresponding condensation units 2 via the corresponding steam pipes 4. The condensation units 2 are individually connected to corresponding separation tanks 3 via a liquid pipe 5. In other words, the upper evaporation unit 1, the middle evaporation unit 1, and the lower evaporation unit 1 are individually connected to the three independent condensation units 2 via the corresponding steam pipes 4. All the condensation units 2 are arranged above the evaporation units 1 and the separation tanks 3.

Next, action and effect of the cooling apparatus 20 thus configured will be described. In the cooling apparatus 20 according to the embodiment, the same number of the condensation units 2 as that of the evaporation units 1 are independently arranged, and individually connected to the evaporation units 1 via the steam pipes 4. In this case, heat exchanging performance between the refrigerant that has flowed into the condensation units 2 and outside air can be enhanced, and cooling performance can be improved.

More specifically, when the plurality of steam pipes 4 individually connected to the plurality of evaporation units 1 are connected to one large condensation unit 2, a gas phase refrigerant that has flowed into the condensation unit 2 may not be sufficiently diffused to all areas of the condensation unit 2. In other words, the gas phase refrigerant that has flowed into the condensation unit 2 may be subjected to sufficient heat exchanging with the outside air only at a center of the condensation unit 2.

On the other hand, in the embodiment, the same number of the condensation units 2 as that of the evaporation units 1 are independently arranged, and the plurality of condensation units 2 are individually connected to the evaporation units 1 via the plurality of steam pipes 4. With this structure, the gas phase refrigerant that has flowed into the condensation units 2 is diffused to all areas in the condensation units 2 because each condensation unit 2 is subdivided to be small in volume. As a result, the gas phase refrigerant can be cooled by using all the condensation units 2, and cooling performance in the condensation units 2 can be improved.

(Fifth Exemplary Embodiment)

Figure 6:
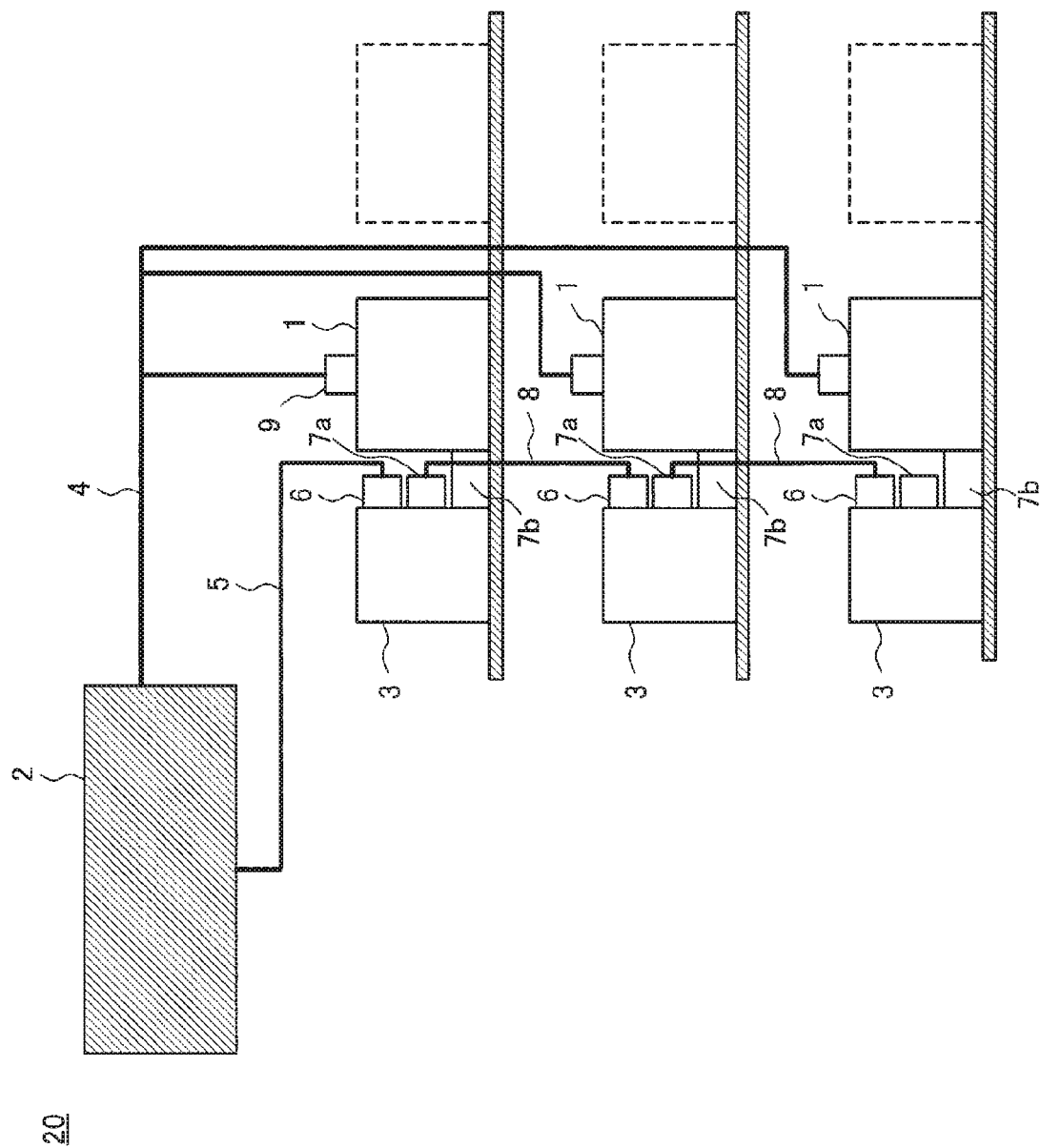
FIG. 6 is a sectional view illustrating the configuration of a cooling apparatus according to a fifth exemplary embodiment of the present invention.

A fifth exemplary embodiment will be described. FIG. 6 is a sectional view illustrating a cooling apparatus 20 according to the embodiment. In the cooling apparatus 20 according to the embodiment, an inlet 6, a first connection port 7a, and a second connection port 7b are arranged on the same side surface of each separation tank 3. Other structures and connection relations are identical or similar to those of the first embodiment, and therefore detailed description will be omitted. In FIG. 6, three electronic devices and three evaporation units 1 are arranged in the vertical direction. However, the present invention is not limited to this. Two, or four or more electronic devices and two, or four or more evaporation units 1 can be arranged in the vertical direction.

In the cooling apparatus 20 according to the embodiment, as illustrated in FIG. 6, the inlet 6, the first connection port 7a, and the second connection port 7b are arranged on the same side surface of the separation tank 3. Further, in the cooling apparatus 20 according to the embodiment, the inlet 6, the first connection port 7a, and the second connection port 7b are arranged on the side surface of the separation tank 3 facing the evaporation unit 1.

Next, action and effect of the cooling apparatus 20 thus configured will be described. In the cooling apparatus 20 according to the embodiment, as illustrated in FIG. 6, each evaporation unit 1 includes the inlet 6, the first connection port 7a, and the second connection port 7b on the same side surface. Accordingly, nozzles can be disposed on one side surface, and the cooling apparatus 20 can be reduced in size and height. In other words, when the inlet 6 is disposed on the side surface of the separation tank 3, the surface facing the evaporation unit 1, the cooling apparatus 20 can be reduced in height compared with a case where the inlet 6 is disposed on a top surface of the separation tank 3. When the first connection port 7a and the second connection port 7b arranged on the side surface of the separation tank 3 are arranged on the side surface of the separation tank 3 at the side facing the evaporation unit 1, the first connection port 7a, the second connection port 7b, a liquid pipe 5, and separation piping 8 can be housed between the evaporation unit 1 and the separation tank 3, and the cooling apparatus 20 can be miniaturized.

(Sixth Exemplary Embodiment)

Figure 7:
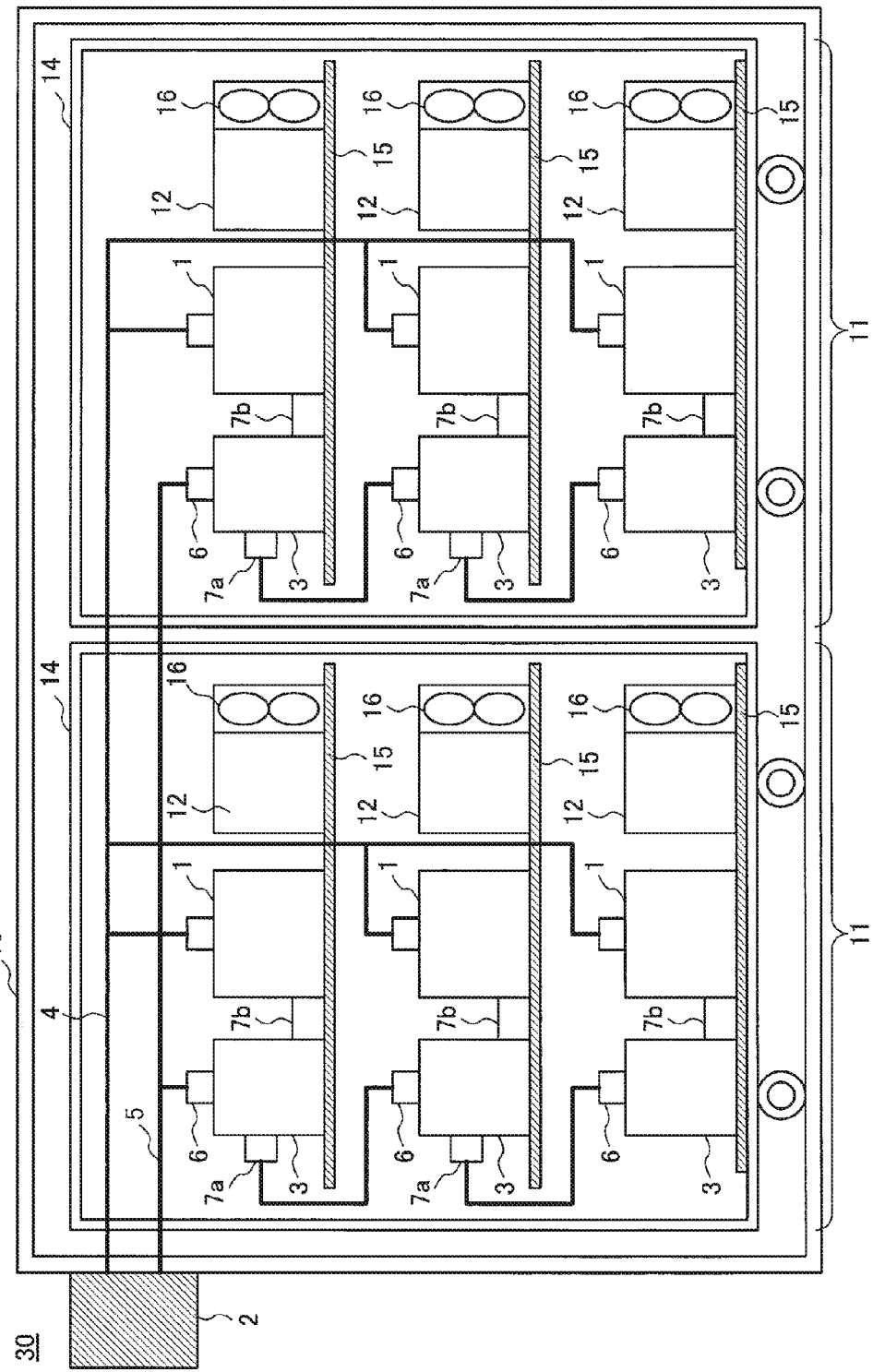
FIG. 7 is a sectional view illustrating the configuration of a cooling system according to a sixth exemplary embodiment of the present invention.

A sixth exemplary embodiment will be described. FIG. 7 is a sectional view illustrating a cooling system 30 according to the embodiment. The cooling system 30 according to the embodiment includes a cooling apparatus 20, racks 11, electronic devices 12, and a server room 13. The cooling apparatus 20, which is identical or similar to the cooling apparatus 20 described in the second embodiment, includes evaporation units 1, a condensation unit 2, separation tanks 3, a steam pipe 4, and a liquid pipe 5. There is no restriction on a connection method between each evaporation unit 1 and corresponding separation tank 3 as long as they are connected below a first connection port 7a. In FIG. 7, a connection part between the evaporation unit 1 and the separation tank 3 is illustrated as a second connection port 7b.

The cooling system 30 includes a plurality of racks 11 in the server room 13. In FIG. 7, two racks are installed in the server room 13, however, the present invention is not limited to this. The evaporation units 1 and the separation tanks 3 of the cooling apparatus 20 are arranged in the racks 11 housing the electronic devices 12, and the condensation unit 2 of the cooling apparatus 20 is disposed outside the server room 13.

Each rack 11 includes a casing 14 and a plurality of mounting shelves 15 for mounting the electronic devices 12. The evaporation unit 1, the separation tank 3, and the electronic device 12 are arranged on each of the plurality of mounting shelves 15. The evaporation unit 1 is located at a height substantially equal to that of the electronic device 12, namely, at a position so as to face the electronic device 12 in a horizontal direction. Each evaporation unit 1 and the condensation unit 2 are connected to each other via the steam pipe 4, and the condensation tank 2 and the separation tank 3 are connected to each other via the liquid pipe 5.

A blower 16 for cooling heat discharged from the electronic device 12 is mounted on each mounting shelf 15. The electronic device 12 is disposed on each mounting shelf 15 so that air sent from the blower 16 can be discharged out of the casing 14 via the evaporation unit 1. The blower 16 may be disposed in the electronic device 12.

Although it is not illustrated in FIG. 7, the casing 14 includes through-holes formed to insert the steam pipe 4 and the liquid pipe 5, and a plurality of discharge holes formed to discharge the air discharged from the electronic devices 12 out of the casing 14.

The steam pipe 4 and the liquid pipe 5 are inserted through the through-holes to allow a refrigerant to flow between each evaporation unit 1 disposed in the casing 14 and the condensation unit 2 disposed outside the casing 14. The casing 14 includes the discharge holes, whereby the air sent from the blower 16 to cool the electronic device 12 can be discharged out of the rack 11.

In the cooling system 30 thus configured, when the plurality of racks 11 disposed in the server room 13 is operated, the electronic devices 12 disposed on the mounting shelves 15 of the racks 11 also start to operate. Internal electronic components or the like generate heat when the electronic device 12 continues to operate. A rise in a temperature inside the rack 11 increases probability of a failure of the electronic devices 12. Thus, the blower 16 disposed in each mounting shelf 15 blows air, thereby suppressing the rise in the temperature inside the rack 11.

However, the air discharged from the electronic devices 12 has high temperature because it captures heat from the electronic components, while the server room 13 has a structure generally provided with sealability to prevent a failure of the electronic devices 12 caused by dust. Accordingly, the high-temperature air fills the server room 13 to increase the temperature inside the server room 13. The increased temperature in the server room 13 causes a failure of the electronic devices 12. Thus, the temperature in the server room 13 is preferably decreased by using an air conditioner or the like. However, this requires electric power.

Therefore, in the cooling system 30 according to the embodiment, the evaporation unit 1 is disposed on the mounting shelf 15 on which the electronic component 12 of the rack 11 is disposed, and heat is absorbed from the air discharged from the electronic device 12 by the refrigerant stored in the evaporation unit 1. The high-temperature air discharged from the electronic device 12 is cooled when its heat is captured by the refrigerant.

On the other hand, the refrigerant evaporated by heat absorption in the evaporation unit 1 is transported to the condensation unit 2 installed outside the racks 11 via the steam pipe 4. Steam of the refrigerant transported to the condensation unit 2 is cooled to be condensed by exchanging heat with air outside the server room 13. The condensed refrigerant is refluxed to the evaporation units 1 via the respective separation tanks 3 arrayed in a vertical direction by gravity. Then, the refrigerant boils by heat generated again from a heating element in the evaporation units 1, thereby enabling to continuously perform a cooling cycle.

In other words, the cooling system 30 according to the embodiment can prevent an increase of the temperature inside the server room 13 caused by the high-temperature air discharged from the electronic devices 12 without using any air conditioner.

Concerning refrigerant circulation, a difference in gas-liquid density generated by the boiling and condensing of the refrigerant is used, which may eliminate the necessity of circulating the refrigerant by installing a motor or a pump. In other words, the refrigerant can be circulated while preventing the temperature in the serve room 13 from becoming high without requiring electric power. As a result, power saving and cost increase suppression can be achieved in the cooling system 30.

In the cooling system 30 according to the embodiment, the cooling apparatus 20 described in the second embodiment is included. Specifically, the cooling apparatus 20 includes separation piping 8, and separation tanks 3 each including a first connection port 7a and a second connection port 7b with different height in a vertical direction. A refrigerant cooled to be liquefied in the condensation unit 2 sequentially flows down from an uppermost separation tank 3 to lower separation tanks 3, and flows from each separation tank 3 to the connected evaporation unit 1. As a result, without storing different amounts of refrigerant in the upper evaporation unit 1 and the lower evaporation unit 1, the electronic devices arranged at the plurality of stages in the vertical direction can be evenly cooled.

Thus, in the cooling system 30 according to the embodiment, the electronic devices arranged at the plurality of stages can be easily cooled with a simple structure where the cooling apparatus 20 includes the separation piping 8, and the separation tanks 3 each including the first connection port 7a and the second connection port 7b with different height in the vertical direction.

(Seventh Exemplary Embodiment)

Figure 8:
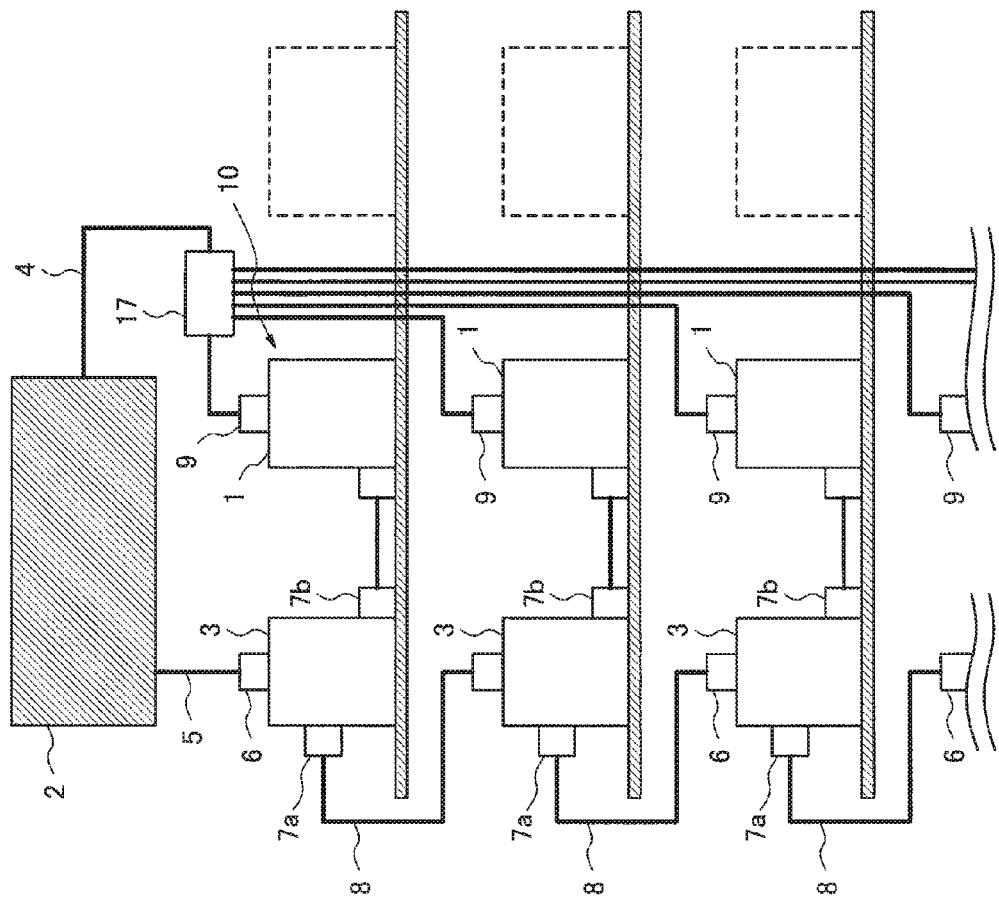
FIG. 8 is a sectional view illustrating the configuration of a cooling apparatus according to a seventh exemplary embodiment of the present invention.

A seventh exemplary embodiment will be described. FIG. 8 is a sectional view illustrating the configuration of a cooling apparatus 20 according to the embodiment. As illustrated in FIG. 8, the cooling apparatus 20 according to the embodiment is disposed corresponding to a plurality of electronic devices stacked in a vertical direction, and includes evaporation units 1, a condensation unit 2, separation tanks 3, steam pipes 4, and a liquid pipe 5.

In the cooling apparatus 20 according to the embodiment, three or more evaporation units 1 and three or more electronic devices are arrayed in the vertical direction. The steam pipes 4 extending from the outlets 9 of the respective evaporation units 1 merge together at a merging unit 17 to be connected to the condensation unit 2. Other structures and connection relations are identical or similar to those of the second embodiment.

Figure 9:
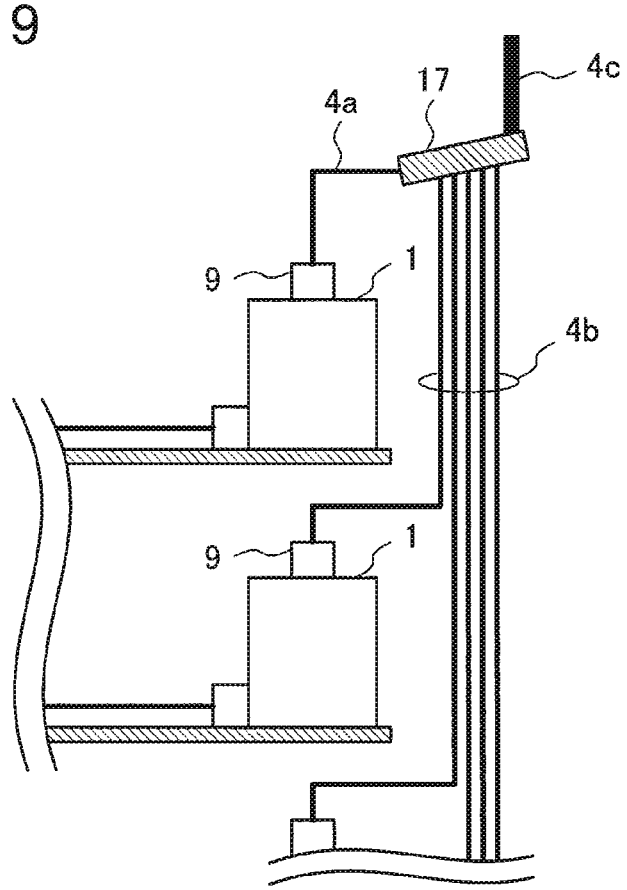
FIG. 9 is a sectional view illustrating the configuration of the cooling apparatus according to the seventh exemplary embodiment of the present invention.
Figure 10:
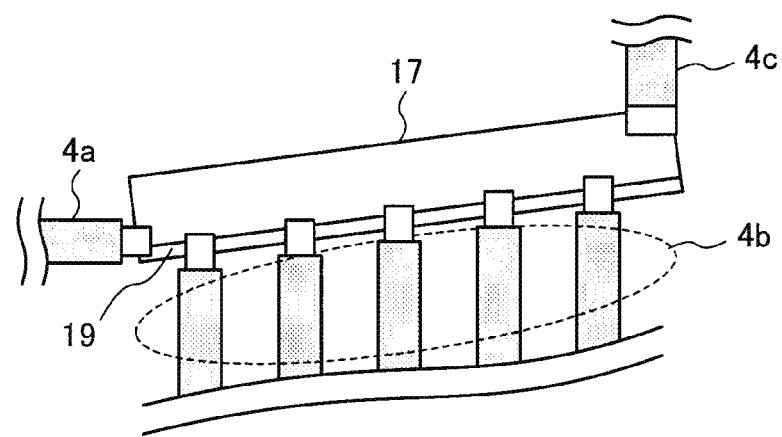
FIG. 10 is a sectional view illustrating the configuration of a merging unit of the cooling apparatus according to the seventh exemplary embodiment of the present invention.
Figure 11:
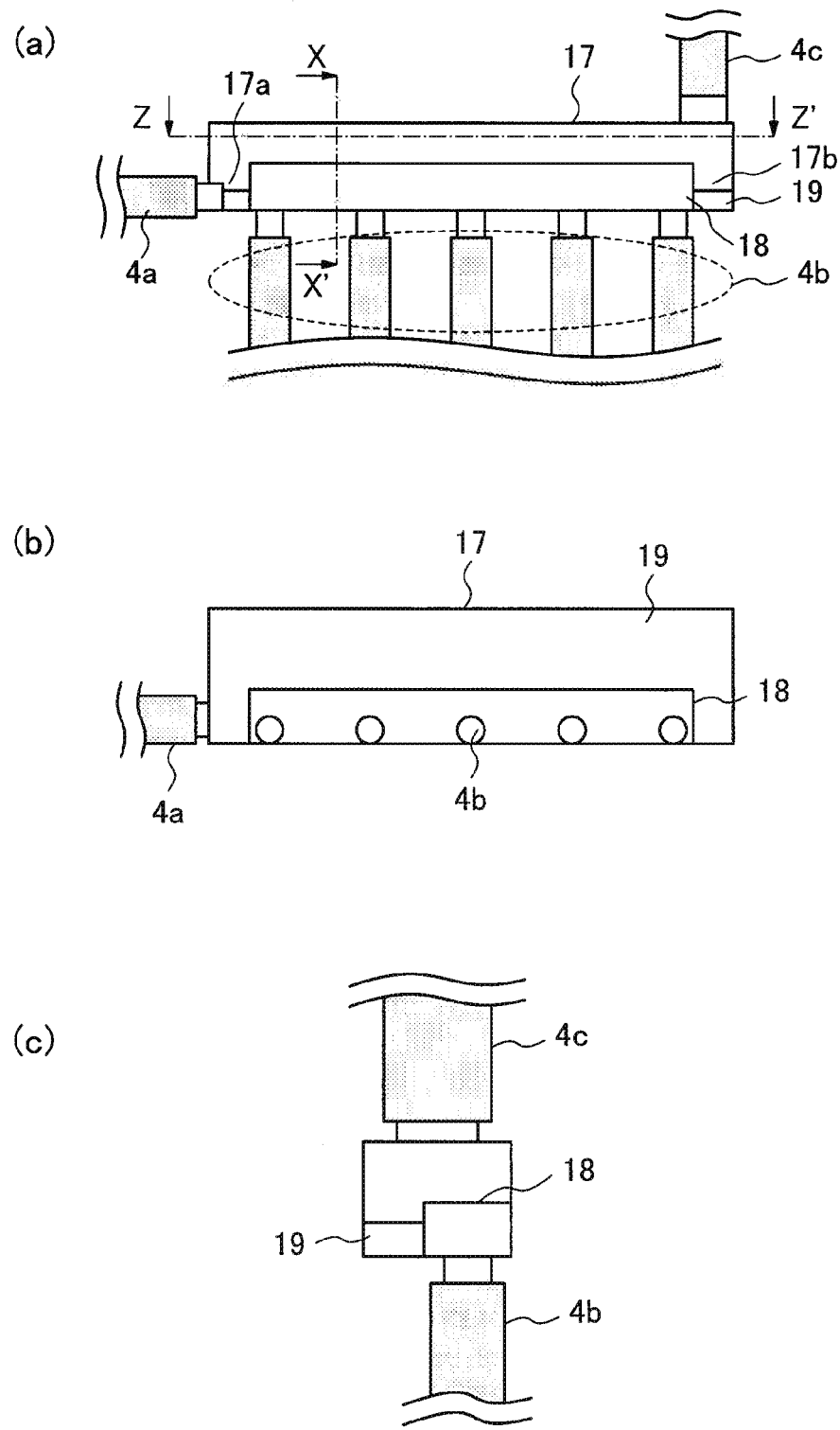
FIG. 11 is a sectional view illustrating the configuration of the merging unit of the cooling apparatus according to the seventh exemplary embodiment of the present invention.

Referring to FIGS. 9, 10 and 11, the merging unit 17 of the steam pipes 4 extending from the respective evaporation units 1 will be described. FIG. 9 is a sectional view illustrating the configuration of the cooling apparatus 20 according to the embodiment. FIGS. 10 and 11 are sectional views each illustrating the configuration of the merging unit of the cooling apparatus 20 according to the embodiment.

As illustrated in FIG. 9, the merging unit 17 is installed at a position higher than an uppermost outlet 9 in the vertical direction. A steam pipe 4a extending from the outlet 9 of the uppermost evaporation unit 1 and steam pipes 4b connected to the other evaporation units 1 are connected together at the merging unit 17. Further, a steam pipe 4c connects the merging unit 17 with the condensation unit 2.

As illustrated in FIG. 10, the steam pipes 4a and 4b extending from the respective outlets 9 are connected to the merging unit 17. The steam pipes 4a and 4b at connection parts are partially protruded in the merging unit 17 to be connected. A connection end of the steam pipe 4a connected to the uppermost outlet 9 in the vertical direction is connected to a part in which liquid tends to stay when the liquid is generated in the merging unit 17 or when the liquid flows into the merging unit 17 from the steam pipe 4c connecting the merging unit 17 with the condensation unit 2. FIG. 10 illustrates a case where the merging unit 17 is disposed to be inclined in a horizontal direction. In this case, the part in which the liquid tends to stay is a lowermost part in the vertical direction, namely, a left part of the merging unit 17 in the figure, and the steam pipe 4a is connected to this position.

On the other hand, as illustrated in (a) of FIG. 11, the merging unit 17 can be disposed substantially along the horizontal direction, and a partition 18 can be disposed around the steam pipes 4b connected to the evaporation units other than the uppermost evaporation unit in the vertical direction. In this case, parts in which the liquid tends to stay are both ends (left part 17a and right part 17b) in which the partition 18 of the merging unit 17 is not disposed. In (a) of FIG. 11, the left part 17a and the steam pipe 4a are connected.

As illustrated in (b) of FIG. 11 that is a sectional view taken along the line Z-Z' illustrated in (a) of FIG. 11, the partition 18 is formed into a structure not covering upper parts of the steam pipes 4b so that the steam can pass through. The partition 18 is formed such that condensate liquid 19 condensed at the merging unit 17 circulates through the steam pipe 4a while no condensate liquid 19 flows through the steam pipes 4b. In this case, steam pipe 4b may not be protruded into the merging unit 17. A sectional view taken along the line X-X' illustrated in (a) of FIG. 11 when steam pipe 4b is not protruded is illustrated in (c) of FIG. 11.

In the cooling apparatus 20 thus configured, the refrigerant stored in the evaporation units 1 each having a sealed structure boils by receiving heat discharged from the electronic devices, and steam of the refrigerant generated by the boiling flows through the steam pipes 4a and 4b by buoyancy generated due to a difference in gas-liquid density into the merging unit 17, and flows out through the steam pipe 4c to the condensation unit 2. When the merging unit 17 is disposed between the evaporation units 1 and the condensation unit 2 and the respective steam pipes are connected to the merging unit 17, the refrigerant condensed before reaching the merging unit 17 is smoothly reduced to each evaporation unit 1.

Figure 13:
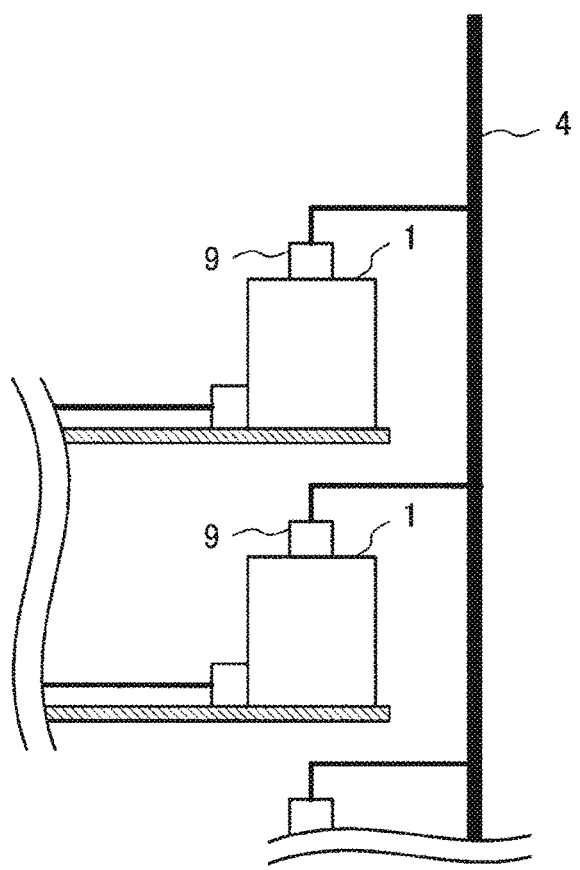
FIG. 13 is a sectional view illustrating the configuration of a comparative example for the cooling apparatus according to the seventh exemplary embodiment of the present invention.

Comparison with a case where the steam pipes are merged at heights of the respective evaporation units 1 will be discussed. In FIG. 13, when the steam of the refrigerant is condensed before the steam reaches the condensation unit 2, a most part of the refrigerant condensed flows into the lowermost evaporation unit 1 in the vertical direction by gravity. When the liquefied refrigerant stays more than necessary in the evaporation unit 1, growth of refrigerant bubbles is suppressed by the weight, consequently degrading evaporation performance. The cooling apparatus 20 according to the embodiment can prevent deterioration of evaporation performance by disposing the merging unit 17 to prevent the liquefied refrigerant from staying more than necessary in the specific evaporation unit 1.

Figure 12:
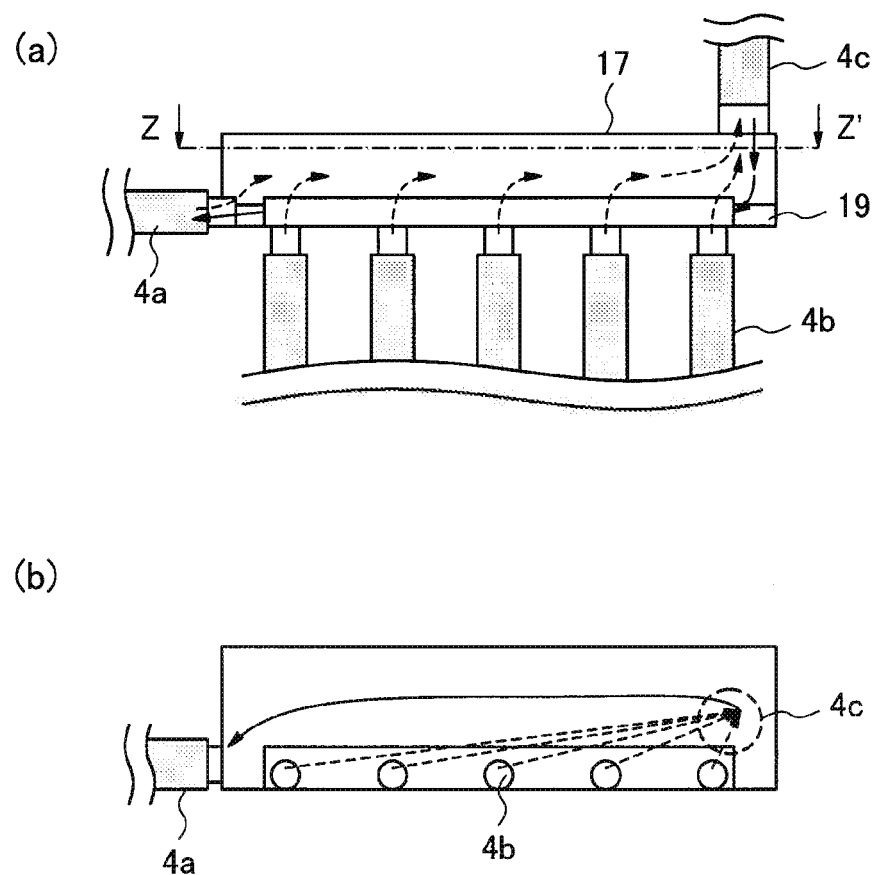
FIG. 12 is a sectional view illustrating an operation of the merging unit of the cooling apparatus according to the seventh exemplary embodiment of the present invention.

The steam of the refrigerant merged at the merging unit 17 flows into the steam pipe 4c by a pressure gradient as illustrated in (a) of FIG. 12. FIG. 12 is a sectional view illustrating operations of the merging unit 17 of the cooling apparatus 20 according to the embodiment. The condensate liquid 19 of the refrigerant condensed in the merging unit 17 or between the merging unit 17 and the condensation unit 2 stays as the condensate liquid 19 in the merging unit 17. The condensate liquid 19 retained in the merging unit 17 can be refluxed to the uppermost evaporation unit 1 in the vertical direction via the steam pipe 4a. Even when the amount of refrigerant increases, the uppermost evaporation unit 1 in the vertical direction can reflux the refrigerant through the separation tank 3 and the separation piping 8 to the lower separation tank 3 and evaporation unit 1. Thus, deterioration of the evaporation performance can be prevented by maintaining the appropriate liquid amount of refrigerant in each evaporation unit 1.

The aforementioned cooling apparatus 20 can be applied to the cooling system 30 according to the sixth embodiment.

(Eighth Exemplary Embodiment)

Figure 14:
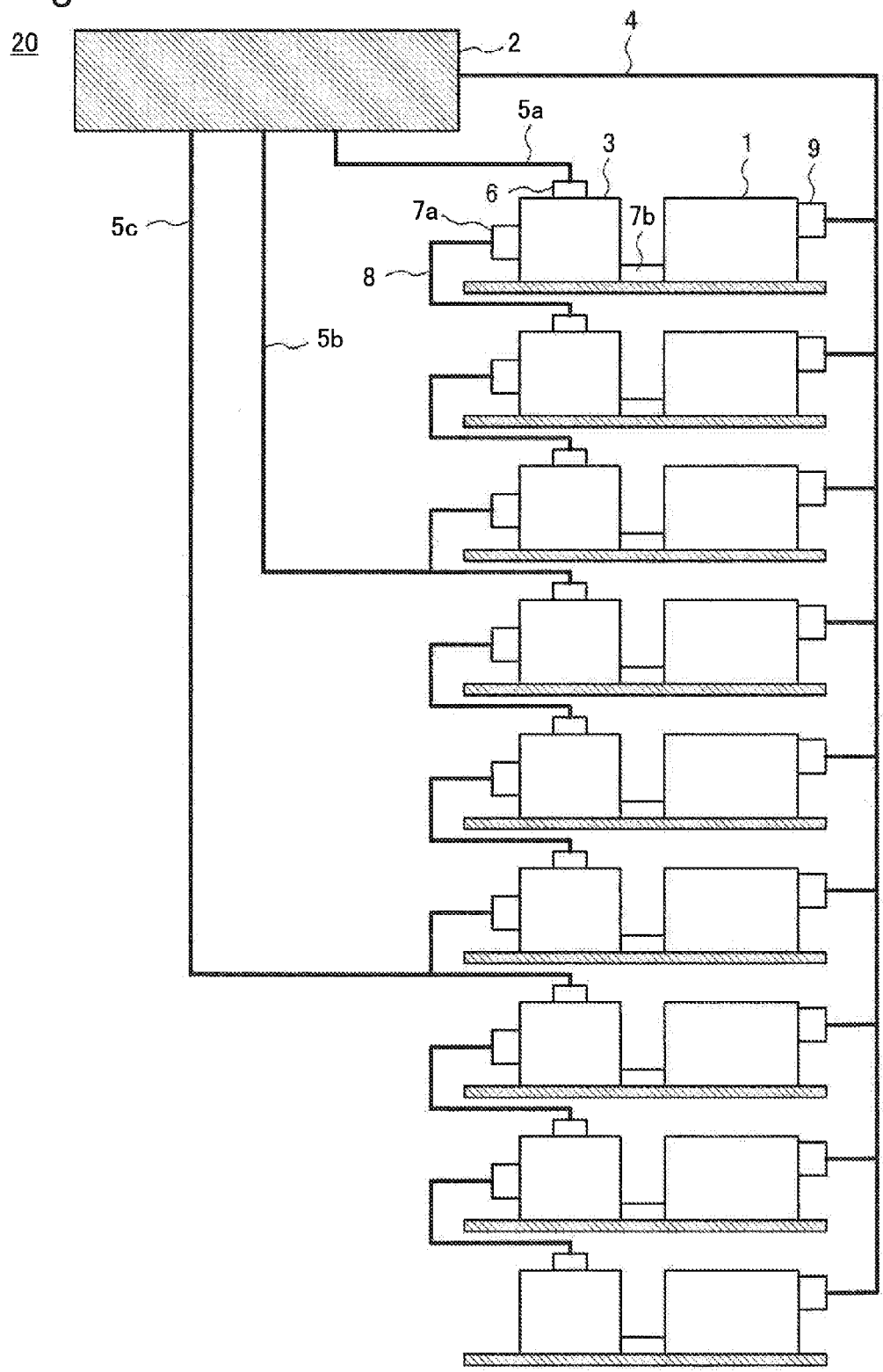
FIG. 14 is a sectional view illustrating the configuration of a cooling apparatus according to an eighth exemplary embodiment of the present invention.

An eighth exemplary embodiment will be described. FIG. 14 is a sectional view illustrating the configuration of a cooling apparatus 20 according to the embodiment. As illustrated in FIG. 14, the cooling apparatus 20 according to the embodiment is disposed corresponding to a plurality of electronic devices stacked in a vertical direction, and includes a plurality of evaporation units 1, a condensation unit 2, separation tanks 3, a steam pipe 4, and liquid pipes 5 with respect to the plurality of electronic devices.

The embodiment is characterized by including a plurality of liquid pipes 5 connected to the condensation unit 2. For example, in the embodiment, three liquid pipes 5a, 5b, and 5c are provided for one condensation unit 2 and nine separation tanks 3 (evaporation units 1). Each of these three liquid pipes 5a, 5b and 5c has one end connected to the condensation unit 2 and the other end connected to an inlet 6 of each different separation tank 3.

In FIG. 14, the liquid pipe 5a is connected to the inlet 6 of the uppermost separation tank 3 in the vertical direction, the liquid pipe 5b is connected to the inlet 6 of the fourth separation tank 3 from the uppermost tank, and the liquid pipe 5c is connected to the inlet 6 of the seventh separation tank 3 from the uppermost tank.

As illustrated in FIG. 14, separation piping 8 of the separation tank 3 on the lowermost stage connected to each liquid pipe 5, namely, of the third and sixth separation tanks 3 from the uppermost tank, is connected to each liquid pipe 5 of the separation tank 3 directly below, namely, of the fourth and seventh separation tanks 3 to which the liquid pipes 5 are connected.

In the exemplary embodiment, the number of liquid pipes 5 is three, however, not limited to this, and the number of liquid pipes 5 may be nine, which is equal to the number of separation tanks 3 (evaporation units 1), for example. In this case, each one of the liquid pipes 5 is connected to the inlet 6 of the separation tank 3.

The cooling apparatus 20 thus configured operates as follows. The steam of a gas phase refrigerant gasified in the evaporation units 1 flows through the steam pipe 4 into the condensation unit 2 by buoyancy generated due to a difference in gas-liquid density. Then, the gas phase refrigerant is cooled in the condensation unit 2 to be condensate liquid.

In FIG. 14, the condensate liquid of the refrigerant first flows into the liquid pipe 5a which is closest to the steam pipe 4 (located on the right) to be supplied to the separation tank 3 disposed to the uppermost evaporator 1. The condensate liquid that has flowed into the uppermost separation tank 3 is supplied to the evaporator 1 via a second connection port 7b to be gasified again in the evaporator 1. After a liquid surface height of the condensate liquid has reached the second connection port 7a, the condensate liquid is supplied to the lower separation tank 3 via the separation piping 8. Further, when the liquid surface height of the condensate liquid reaches the second connection port 7a in the lower separation tank 3, the condensate liquid is supplied to still lower separation tank 3.

Then, in the condenser 2, the condensate liquid that has not flowed out to the liquid pipe 5a subsequently flows into the liquid pipe 5b located at a center of the condenser 2. The condensate liquid that has flowed into the liquid pipe 5b is supplied to the fourth separation tank 3 from the uppermost, and supplied to the evaporator 1 and the lower separation tank 3 as in the case of the condensate liquid that has flowed into the liquid pipe 5a.

Further in the condenser 2, the condensate liquid that has not flowed out to the liquid pipe 5b is supplied to the seventh separation tank 3 from the liquid pipe 5c farthest from the steam pipe 4 (located on the left). The condensate liquid that has been supplied to the seventh separation tank 3 is also subjected to the aforementioned circulation process.

Thus, in the cooling apparatus 20 according to the embodiment, by including the plurality of liquid pipes 5, the condensate liquid of the refrigerant cooled in the condenser 2 is supplied to the plurality of separation tanks 3 through the plurality of liquid pipes 5 substantially at the same time. The condensate liquid can be promptly supplied to the lower separation tank 3. Thus, in the lower evaporator 1, it is possible to prevent a dry-out phenomenon where boiling caused by a shortage of a refrigerant supply does not occur.

Some or all parts of the aforementioned embodiments can be specified as in the following supplemental notes However, the present invention is not limited to the supplemental notes.

[Supplemental Note 1]

A cooling apparatus including: a first evaporation unit storing refrigerant; a condensation unit condensing a gas phase refrigerant; and a first separation tank to which a liquid phase refrigerant is poured, wherein the first separation tank includes a second connection port connected to the first evaporation unit and a first connection port arranged at a position as high as the second connection port or higher than the second connection port, and the condensation unit is connected to the first evaporation unit and the first separation tank.

[Supplemental Note 2]

The cooling apparatus according to Supplemental Note, further including a second separation tank disposed below the first separation tank, and a second evaporation unit disposed below the first evaporation unit, wherein the first separation tank is connected to the second separation tank via the first connection port of the first separation tank, the second separation tank is connected to the second evaporation unit via a second connection port of the second separation tank, and the second evaporation unit is connected to the condensation unit.

[Supplemental Note 3]

The cooling apparatus according to Supplemental Note 1 or 2, further including a third separation tank disposed below the second separation tank, and a third evaporation unit disposed below the second evaporation unit, wherein the second separation tank includes a first connection port arranged at a position as high as the second connection port of the second separation tank or higher than the second connection port, the second separation tank is connected to the third separation tank via the first connection port of the second separation tank, the third separation tank is connected to the third evaporation unit via a second connection port of the third separation tank, and the third evaporation unit is connected to the condensation unit.

[Supplemental Note 4]

The cooling apparatus according to any one of Supplemental Notes 1 to 3, wherein a lower end of the first connection port is arranged at a position as high as a lower end of the second connection port or higher than the lower end of the second connection port, and an upper end of the first connection port is arranged at a position as high as an upper end of the second connection port or higher than the upper end of the second connection port.

[Supplemental Note 5]

The cooling apparatus according to any one of Supplemental Notes 1 to 4, wherein the separation tank and the evaporation unit are disposed to face each other in a horizontal direction.

[Supplemental Note 6]

The cooling apparatus according to any one of Supplemental Notes 1 to 5, wherein the condensation unit is disposed above the separation tank and the evaporation unit.

[Supplemental Note 7]

The cooling apparatus according to any one of Supplemental Notes 1 to 6, wherein a plurality of sets of the separation tanks and the evaporation units are provided, the plurality of sets are arrayed in a vertical direction, an inlet of an uppermost separation tank is connected to the condensation unit via a liquid pipe, an inlet of each of the separation tanks other than the uppermost separation tank is connected to the first connection port of upper separation tank via separation piping, and the evaporation unit is connected to the condensation unit via a steam pipe.

[Supplemental Note 8]

The cooling apparatus according to any one of Supplemental Notes 1 to 7, wherein the evaporation units are connected to the condensation unit via individually independent steam pipes.

[Supplemental Note 9]

The cooling apparatus according to any one of Supplemental Notes 1 to 8, further including a plurality of condensation units, wherein the evaporation units are individually connected to the plurality of condensation units via the steam pipes.

[Supplemental Note 10]

The cooling apparatus according to any one of Supplemental Notes 1 to 9, wherein the second connection port is connected to the evaporation unit via piping.

[Supplemental Note 11]

The cooling apparatus according to any one of Supplemental Notes 1 to 9, wherein the second connection port is formed integrally with the evaporation unit.

[Supplemental Note 12]

The cooling apparatus according to Supplemental Note 7, wherein the inlet, the first connection port, and the second connection port are disposed on the same side surface of the separation tank.

[Supplemental Note 13]

The cooling apparatus according to Supplemental Note 12, wherein the inlet, the first connection port, and the second connection port are arranged on a side surface of the separation tank, the surface facing the evaporation unit.

[Supplemental Note 14]

The cooling system according to any one of Supplemental Notes 1 to 13, including a rack including a casing, electronic devices and a plurality of stages of mounting shelves for mounting the electronic devices, wherein the evaporation units and the electronic devices are disposed on the mounting shelves to face each other, and the condensation unit is disposed outside the casing.

[Supplemental Note 15]

The cooling system according to Supplemental Note 14, wherein the casing includes through-holes for inserting the steam pipe and the liquid pipe, and a plurality of exhaust holes for discharging air sent from the electronic devices to the outside.

[Supplemental Note 16]

A cooling apparatus including a plurality of refrigerant storage units storing refrigerants, and a condensation unit disposed above the refrigerant storage units, wherein a first refrigerant storage unit among the plurality of refrigerant storage units includes an outlet to which a steam pipe connected to the condensation unit to circulate a gas phase refrigerant is connected, an inlet connected to either a liquid pipe connected to the condensation unit to circulate a liquid phase refrigerant or first separation piping connected to a second refrigerant storage unit located above the first refrigerant storage unit, and a first connection port for connecting second separation piping connected to a third refrigerant storage unit located vertically below the first refrigerant storage unit, and the first connection port is located vertically below the outlet and the inlet.

[Supplemental Note 17]

The cooling apparatus according to Supplemental Note 16, wherein each of the refrigerant storage units includes an evaporation unit and a separation tank, the evaporation unit includes the outlet, the separation tank includes the inlet and the first connection port, and the evaporation unit and the separation tank are communicated with each other via a second connection port connected below the first connection port.

[Supplemental Note 18]

The cooling apparatus according to Supplemental Note 16 or 17, further including a merging unit disposed between, among the plurality of refrigerant storage units, an uppermost refrigerant storage unit located at an uppermost part in a vertical direction and the condensation unit, wherein the merging unit is connected to the steam pipe connected to the plurality of refrigerant storage units, and the condensation unit.

[Supplemental Note 19]

The cooling apparatus according to Supplemental Note 18, wherein the merging unit is disposed to be inclined in a horizontal direction, and the steam pipe connected to the uppermost refrigerant storage unit is connected to the merging unit at a position vertically below any of the other steam pipes.

[Supplemental Note 20]

The cooling apparatus according to Supplemental Note 18, wherein the merging unit includes a partition, wherein the partition is disposed around the connection ports to which the other steam pipes excluding the steam pipe connected to the uppermost refrigerant storage unit are connected.

[Supplemental Note 21]

The cooling system according to Supplemental Note 1 or 16, wherein a plurality of sets of separation tanks and evaporation units are disposed, the plurality of sets are arrayed in a vertical direction, a plurality of liquid pipes, the number of which is the same as or less than the evaporators, are disposed from the condensation unit, the plurality of liquid pipes are connected to inlets of the separation tanks in the plurality of sets, and are connected to the first connection port of the separation tank and an inlet of a separation tank installed below the separation tank, and the liquid pipe and the separation piping from the first connection port are connected to each other.

The present invention is not limited to the aforementioned exemplary embodiments and design changes or the like made within a scope without departing from the gist of the present invention are included in the invention. This application claims priority based on Japanese Patent Application No. 2012-029603 filed on Feb. 14, 2012, and Japanese Patent Application No. 2012-241992 filed on Nov. 1, 2012, disclosure of which are hereby incorporated by reference in their entirety.

INDUSTRIAL APPLICABILITY

The present invention can be widely applied to a cooling apparatus that cools heat generating members arranged at a plurality of stages in a vertical direction.

REFERENCE SIGNS LIST

1 Evaporation unit
2 Condensation unit
3 Separation tank
4 Steam pipe
5 Liquid pipe
6 Inlet
7a First connection port
7b Second connection port
8 Separation piping
9 Outlet 10 Refrigerant storage unit
11 Rack
12 Electronic device
13 Server room
14 Casing
15 Mounting shelf
16 Blower
17 Merging unit
18 Partition
19 Condensate liquid
20 Cooling apparatus
30 Cooling system

The invention claimed is:

1. A cooling apparatus comprising:
N (N is an integer of 2 or larger) refrigerant storage units disposed in a vertical direction and configured to store refrigerants;
a condensation unit disposed above the N refrigerant storage units;
a steam pipe for circulating a gas phase refrigerants flowing out of the N refrigerant storage units to the condensation unit;
a liquid pipe for circulating a liquid phase refrigerant flowing out of the condensation unit to an uppermost refrigerant storage unit; and
a separation piping for circulating the liquid phase refrigerant flowing out of an upper refrigerant storage unit to a lower refrigerant storage unit,
wherein the liquid phase refrigerant flows into each refrigerant storage unit via an inlet, and flows out from the refrigerant storage unit via a first connection port formed below the inlet.

2. The cooling apparatus according to claim 1, wherein the gas phase refrigerants flow out from the refrigerant storage unit via an outlet to the condensation unit; and the first connection port is formed below the outlet.

3. The cooling apparatus according to claim 1, wherein each of the N refrigerant storage units includes a separation tank connected to the liquid pipe or the separation piping, and an evaporation unit connected to the steam pipe; and
the separation tank and the evaporation unit are connected to each other via a second connection port formed below the first connection port.

4. The cooling apparatus according to claim 3, wherein the separation tank and the evaporation unit are disposed to face each other in a horizontal direction.

5. The cooling apparatus according to claim 3, wherein the separation tank and the evaporation unit are connected to each other via piping.

6. The cooling apparatus according to claim 3, wherein the separation tank, the evaporation unit, and a connection unit including the second connection port are integrally formed.

7. The cooling apparatus according to claim 3, wherein the inlet, the first connection port, and the second connection port are formed on the same side surface of the separation tank.

8. The cooling apparatus according to claim 7, wherein the inlet, the first connection port, and the second connection port are disposed on a side surface of the separation tank, the surface facing the evaporation unit.

9. The cooling apparatus according to claim 1, wherein a lower end of the first connection port is set at a position as high as a lower end of the second connection port or higher than the lower end of the second connection port; and
an upper end of the first connection port is set at a position as high as an upper end of the second connection port or higher than the upper end of the second connection port.

10. The cooling apparatus according to claim 1, wherein a first connection port of a lowermost refrigerant storage unit is closed.

11. The cooling apparatus according to claim 1, wherein the number of the steam pipes is N, and N steam pipes are arranged to connect corresponding refrigerant storage units to the condensation unit.

12. The cooling apparatus according to claim 11, wherein the number of the condensation units is N, and N condensation units are arranged to be connected to the corresponding refrigerant storage units via the corresponding steam pipes.

13. The cooling apparatus according to claim 1, further comprising a merging unit disposed between the uppermost refrigerant storage unit and the condensation unit, and connected to a first steam pipe connected to the uppermost refrigerant storage unit, N−1 second steam pipes connected to the refrigerant storage units other than the uppermost storage unit, and a third steam pipe connected to the condensation unit, wherein
a connection port of the first steam pipe is located below connection ports of the N−1 second steam pipes; and
a connection port of the third steam pipe is located above the connection ports of the N−1 second steam pipes.

14. The cooling apparatus according to claim 13, wherein the merging unit is inclined in the horizontal direction.

15. The cooling apparatus according to claim 13, wherein the merging unit includes a partition disposed around the connection ports of the N−1 second steam pipes.

16. The cooling apparatus according to claim 1, wherein n (2≤n≤N) liquid pipes are provided;
one of the n liquid pipes is used for circulating the liquid phase refrigerant flowing out of the condensation unit to the uppermost refrigerant storage unit; and
the remaining n−1 liquid pipes are connected to n−1 refrigerant storage units in place of the separation piping, and are used for circulating the liquid phase refrigerant flowing out of the condensation unit to the connected n−1 refrigerant storage units.

17. The cooling apparatus according to claim 16, wherein the remaining n−1 liquid pipes are connected to separation piping of refrigerant storage units located directly above.

18. A cooling system comprising:
a casing;
electronic devices;
a plurality of stages of mounting shelves for mounting the electronic devices; and
the cooling apparatus according to claim 1, wherein
the evaporation units and the electronic devices are disposed on the mounting shelves to face each other, and
the condensation unit is disposed outside the casing.

19. The cooling system according to claim 18, wherein the casing includes through-holes for inserting the steam pipe and the liquid pipe, and a plurality of exhaust holes for discharging air sent from the electronic devices to the outside.

* * * * *